(12) United States Patent
Huang et al.

(10) Patent No.: US 10,374,588 B2
(45) Date of Patent: Aug. 6, 2019

(54) QUADRATURE CLOCK GENERATING MECHANISM OF COMMUNICATION SYSTEM TRANSMITTER

(71) Applicant: MEDIATEK INC., Hsin-Chu (TW)

(72) Inventors: Po-Chun Huang, Yilan County (TW); Chao-Ching Hung, Changhua County (TW); Yu-Li Hsueh, New Taipei (TW); Pang-Ning Chen, Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 135 days.

(21) Appl. No.: 15/717,919

(22) Filed: Sep. 27, 2017

(65) Prior Publication Data

US 2018/0123575 A1    May 3, 2018

Related U.S. Application Data

(60) Provisional application No. 62/414,828, filed on Oct. 31, 2016.

(51) Int. Cl.
| H03K 5/12 | (2006.01) |
| H03K 5/15 | (2006.01) |
| H03K 21/02 | (2006.01) |
| H04B 1/04 | (2006.01) |

(52) U.S. Cl.
CPC ....... H03K 5/15046 (2013.01); H03K 21/026 (2013.01); H04B 1/04 (2013.01)

(58) Field of Classification Search
None
See application file for complete search history.

(56) References Cited

U.S. PATENT DOCUMENTS

| 5,287,555 | A | 2/1994 | Wilson | |
| 7,825,703 | B2 | 11/2010 | Qiao | |
| 8,086,188 | B2* | 12/2011 | Tanaka | H04B 1/28 455/118 |
| 8,193,840 | B2* | 6/2012 | Cho | H03K 23/68 327/113 |

(Continued)

FOREIGN PATENT DOCUMENTS

CN    102122955 B    11/2012

OTHER PUBLICATIONS

Stefano Pellerano; Paolo Madoglio; Yorgos Palaskas, A 4.75-GHz Fractional Frequency Divider-by-1.25 With TDC-Based All-Digital Spur Calibration in 45-nm CMOS, Dec. 15, 2009, pp. 3422-3433, vol. 44, Issue 12, IEEE.

*Primary Examiner* — Lincoln D Donovan
*Assistant Examiner* — Khareem E Almo
(74) *Attorney, Agent, or Firm* — Winston Hsu (57) ABSTRACT

A quadrature clock generating apparatus connected to a local oscillator generating an input clock signal and an inverted input clock signal includes a fractional dividing circuit and a quadrature signal generating circuit. The fractional dividing circuit is configured for receiving the input clock signal and the inverted input clock signal, and for performing frequency-division upon the input clock signal and the inverted input clock signal to generate a frequency-divided clock signal according to a fractional dividing parameter. The quadrature signal generating circuit is configured for receiving the input clock signal, the inverted input clock signal, and the frequency-divided clock signal to generate a plurality of quadrature clock signals.

9 Claims, 5 Drawing Sheets

(56) References Cited

U.S. PATENT DOCUMENTS

| | | | | |
|---|---|---|---|---|
| 8,319,532 | B2 | 11/2012 | Hsueh | |
| 8,346,180 | B2 * | 1/2013 | Kamizuma | H04B 1/0082 |
| | | | | 455/73 |
| 8,653,862 | B2 | 2/2014 | Lin | |
| 8,803,568 | B2 * | 8/2014 | Leung | H03B 27/00 |
| | | | | 327/115 |
| 8,917,122 | B1 * | 12/2014 | Koerner | H03K 21/10 |
| | | | | 327/115 |
| 8,988,119 | B2 * | 3/2015 | Danny | H03L 7/081 |
| | | | | 327/115 |
| 9,007,132 | B2 * | 4/2015 | Ding | H03B 27/00 |
| | | | | 327/115 |
| 9,013,213 | B2 * | 4/2015 | Chandrashekar | H03K 21/026 |
| | | | | 327/115 |
| 9,118,333 | B1 * | 8/2015 | Mika | H03K 23/70 |
| 9,438,257 | B1 * | 9/2016 | Perdoor | H04L 7/0331 |
| 9,531,358 | B2 * | 12/2016 | Tseng | H03K 19/21 |
| 9,581,973 | B1 * | 2/2017 | Goyal | G04F 5/04 |
| 10,164,622 | B2 * | 12/2018 | Shi | H03K 5/15066 |
| 10,236,889 | B1 * | 3/2019 | Tsai | G06F 1/06 |
| 2001/0048715 | A1 * | 12/2001 | Lee | H03H 11/22 |
| | | | | 375/219 |
| 2014/0139272 | A1 * | 5/2014 | Tertinek | H03K 21/10 |
| | | | | 327/117 |
| 2014/0320173 | A1 * | 10/2014 | Cloutier | H03L 7/1976 |
| | | | | 327/107 |
| 2018/0241379 | A1 * | 8/2018 | Murphy | H03K 5/15013 |

* cited by examiner

QUADRATURE CLOCK GENERATING MECHANISM OF COMMUNICATION SYSTEM TRANSMITTER

CROSS REFERENCE TO RELATED APPLICATIONS

This application claims priority of U.S. provisional application Ser. No. 62/414,828 filed on Oct. 31, 2016, which is entirely incorporated herein by reference.

BACKGROUND

The invention relates to a clock signal generator mechanism, and more particularly to a quadrature clock signal generating apparatus and a communication system transmitter.

Generally speaking, a conventional local oscillator signal generator is used for generating quadrature clock signals by adopting an oscillator to generate a clock signal and an inverted clock signal, using a phase generator for generating clock signals with different phases, and finally using a phase selecting circuit to select clock signals with appropriate phases as its outputs. However, the generated clock signals with different phases correspond to a high frequency which requires that the circuit elements operate at a higher frequency and inevitably increases higher power consumption. In addition, it is easier to introduce delay mismatch for the signals. Also, a timing circuit within the conventional local oscillator signal generator needs to operate at a particular frequency range, and it is more difficult to guarantee the functionality of the timing circuit when the conventional phase selecting circuit is used on corner variation. For example, the functionality of the timing circuit may be significantly affected if the operation rate/frequency of such timing circuit does not fall within a frequency range corresponding to a range from 0.75 times TCK to one TCK wherein TCK means the period of a clock signal generated by a local oscillator.

Further, another conventional scheme may adopt a calibration mechanism to obtain excellent spur performance but also encounters the problems of higher power consumption and difficulty of guaranteeing the functionality of a timing circuit. Also, this conventional scheme does not generate and provide quadrature signal outputs.

Further, for an IoT (Internet of Things) application such as a Bluetooth system, in order to avoid signal pulling from a power amplifier, it is needed to design or configure the frequency of an output signal generated by a local oscillator to be not equal to an integer multiple of the local clock signal inputted to a local mixer. However, a conventional clock signal generator with a fractional divider inevitably consumes more power than a conventional clock signal generator with an integer divider, and low power consumption is critical requirement for such IoT application.

SUMMARY

Therefore one of the objectives of the invention is to provide a quadrature clock signal generating apparatus, to solve the above-mentioned problems.

According to embodiments of the invention, a quadrature clock generating apparatus connected to a local oscillator generating an input clock signal and an inverted input clock signal is disclosed. The quadrature clock generating apparatus comprises a fractional dividing circuit and a quadrature signal generating circuit. The fractional dividing circuit is coupled to the local oscillator and configured for receiving the input clock signal and the inverted input clock signal, and for perform frequency-division upon the input clock signal and the inverted input clock signal to generate a frequency-divided clock signal according to a fractional dividing parameter. The quadrature signal generating circuit is coupled to the fractional dividing circuit and the local oscillator, and is configured for receiving the input clock signal, the inverted input clock signal, and the frequency-divided clock signal to generate a plurality of quadrature clock signals.

According to the embodiments, a communication system transmitter comprising the quadrature clock generating apparatus, a mixer, a band-pass filter, and a power amplifier is disclosed. The mixer is connected to the quadrature clock generating apparatus and configured for performing up-conversion upon a baseband signal to generate an up-converted signal according to the four quadrature clock signals. The band-pass filter is connected to the mixer and configured for performing band-pass filtering upon the up-converted signal. The power amplifier is connected to the band-pass filter and configured for controlling a power of the up-converted signal with a power gain so as to transmit the up-converted signal into air via an antenna circuit of the communication system transmitter.

According to the embodiments, the invention can provide moderate spur performance, generate quadrature signal outputs, reduce power consumption, and make less difficult guaranteeing the functionality of a timing circuit. It is easier to implement the timing circuit with a frequency range corresponding to the range from zero to 0.5 times TCK since readers/designers only need to configure the operation frequency/rate of such timing circuit as a frequency higher than double of the clock frequency corresponding to the period of a clock signal generated by a local oscillator.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
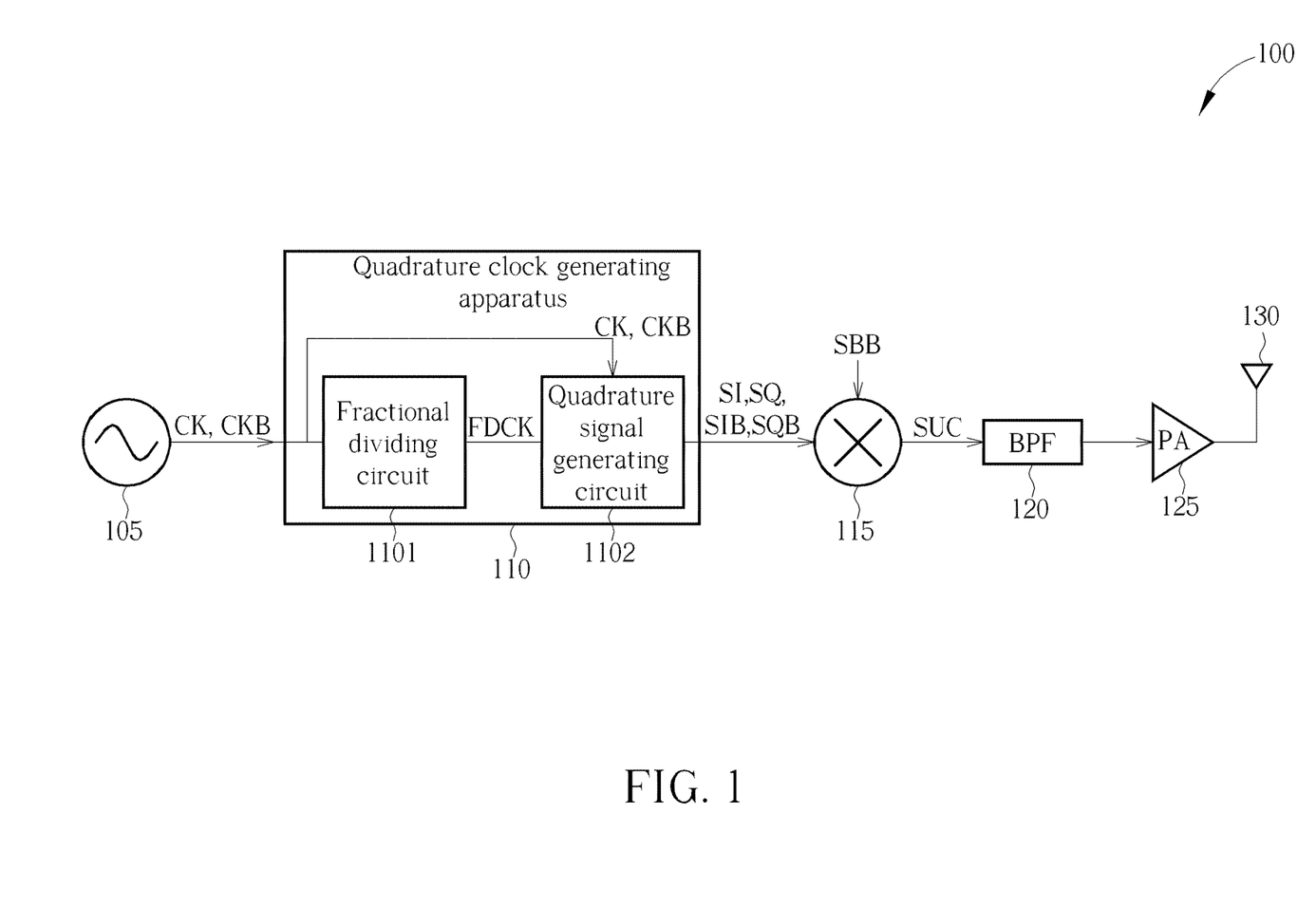
FIG. 1 is a diagram of a communication system transmitter according to an embodiment of the invention.

FIG. 1 is a diagram of a communication system transmitter 100 according to an embodiment of the invention. The transmitter 100 comprises a local oscillator 105, a quadrature clock generating apparatus 110, a mixer 115, a band-pass filter 120, a power amplifier 125, and an antenna circuit 130. The local oscillator 105 such as a voltage-controlled oscillator (VCO) is configured for generating an input clock signal CK and an inverted input clock signal CKB. The quadrature clock generating apparatus 110 is connected to the local oscillator 105 and arranged for generating four quadrature clock signals SI, SQ, SIB, and SQB with phase differences of 90 degrees. The mixer 115 is connected to the quadrature clock generating apparatus 110 and is configured for performing up-conversion upon a baseband signal (data signal) SBB to generate an up-converted signal SUC according to the four quadrature clock signals SI, SQ, SIB, and SQB. The band-pass filter 120 is connected to the mixer 115 and is configured for performing band-pass filtering upon the up-converted signal SUC. The power amplifier 125 is connected to the band-pass filter 120 and is configured for controlling a power of the up-converted signal SUC with a power gain so as to transmit the up-converted signal SUC into the air via the antenna circuit 130 of the communication system transmitter 100. It should be noted that in some particular applications (e.g. Bluetooth system) the local oscillator 105 of the transmitter 100 can be designed to generate an oscillation frequency which is non-integer multiple of the four quadrature clock signals SI, SQ, SIB, and SQB generated by the quadrature clock generating apparatus 110 so as to avoid frequency pulling caused by the feedback from the power amplifier 125. In addition, to achieve the performance requirement of low power consumption, the quadrature clock generating apparatus 110 is arranged to generate the four quadrature clock signals SI, SQ, SIB, and SQB with different phases by performing frequency dividing upon the oscillation frequency such as 6 GHz based on a fractional dividing parameter (e.g. 2.5) to generate a down-converted frequency such as 2.4 GHz and then generating the four quadrature clock signals SI, SQ, SIB, and SQB with quadrature phases according to the down-converted frequency. Compared to the conventional scheme, the communication system transmitter 100 is able to avoid generation of the frequency pulling, achieve low power consumption, and can generate and output four quadrature clock signals SI, SQ, SIB, and SQB to the mixer 115.

As shown in FIG. 1, in practice, the quadrature clock generating apparatus 110 comprises a fractional dividing circuit 1101 and a quadrature signal generating circuit 1102. The fractional dividing circuit 1101 is coupled to the local oscillator 105 and is configured for receiving the input clock signal CK and the inverted input clock signal CKB and for performing frequency-division upon the input clock signal CK and inverted input clock signal CKB to generate a frequency-divided clock signal FDCK according to a fractional dividing parameter (e.g. 2.5) wherein the frequency-divided clock signal FDCK has a frequency (e.g. 2.4 GHz) lower than a frequency (e.g. 6 GHz) of the input clock signal CK. The quadrature signal generating circuit 1102 is coupled to the fractional dividing circuit 1101 and the local oscillator 105 and is configured for receiving the frequency-divided clock signal FDCK, input clock signal CK, and inverted input clock signal CKB and for generating the four quadrature clock signals SI, SQ, SIB, and SQB according to the signals FDCK, CK, and CKB. The quadrature signal generating circuit 1102 is arranged for generating the quadrature clock signals SI, SQ, SIB, and SQB by delaying a phase of the frequency-divided clock signal FDCK with different phase shifts according to the input clock signal CK and the inverted input clock signal CKB.

Figure 2:
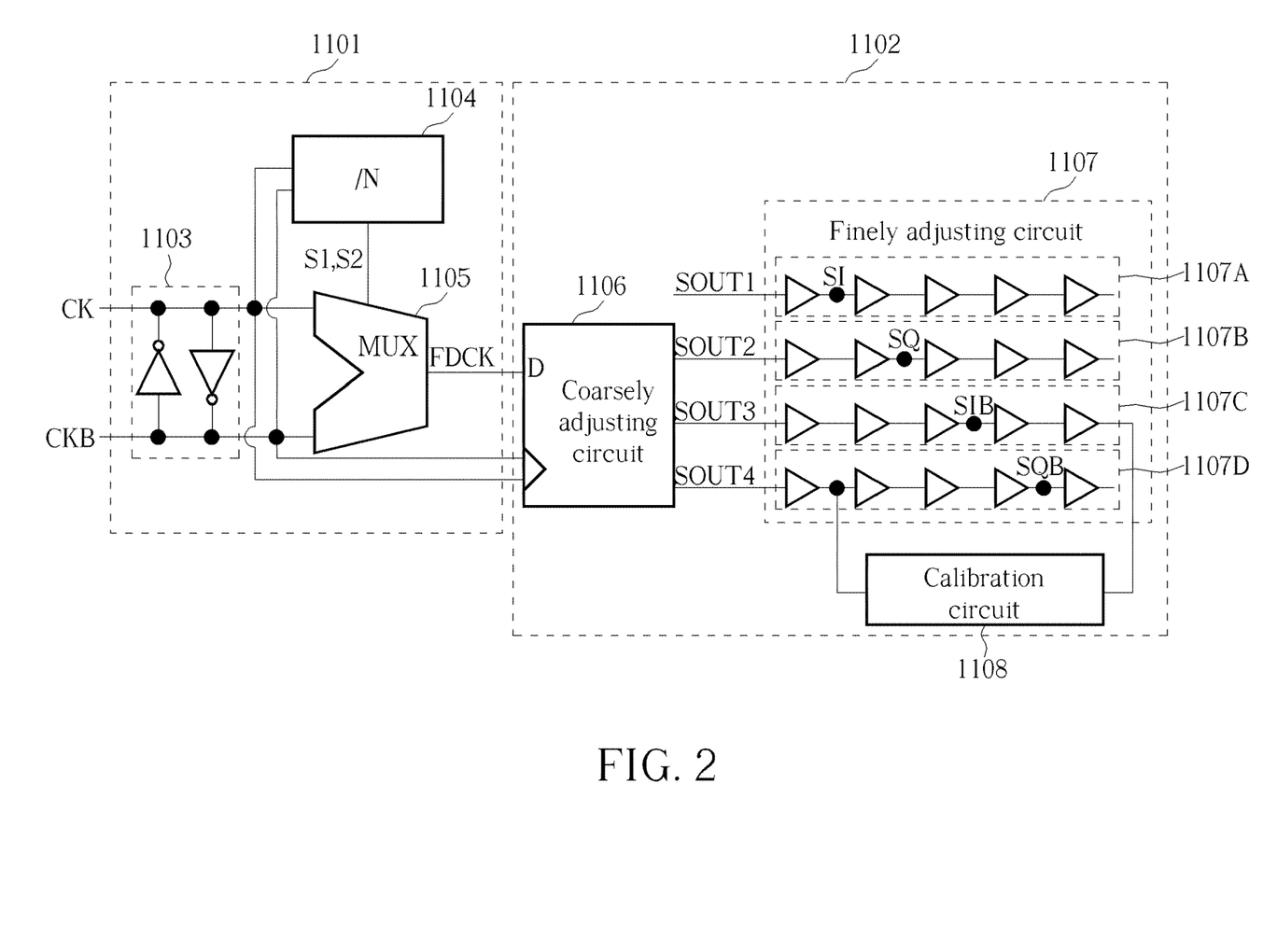
FIG. 2 is a diagram of an embodiment of quadrature clock generating apparatus as shown in FIG. 1.

FIG. 2 is a diagram of an embodiment of quadrature clock generating apparatus 110 as shown in FIG. 1. The fractional dividing circuit 1101 such as a fractional divider with the fractional dividing parameter of 2.5 comprises a latch circuit 1103, a divider 1104 with an integer dividing parameter N, and a multiplexer circuit 1105. In one embodiment, the integer dividing parameter N of the divider 1104 can be 5 and it is not a limitation to the scope of the present application. The latch circuit 1103 is configured for latching the input clock signal CK and the inverted input clock signal CKB, and for example comprises two inverters each having an input terminal connected to an output terminal of the other inverter. The input clock signal CK and inverted input clock signal CKB are connected to two output terminals of the two inverters, respectively. Accordingly, the latch circuit 1103 can be used for actually maintaining the input clock signal CK and inverted input clock signal CKB at two opposite phases. This actually ensures that the phase difference between the clock signals CK and CKB generated by the local oscillator 105 is equal to 180 degrees. However, it should be noted that the implementation of the latch circuit 1103 is optional, and in another embodiment, the fractional dividing circuit 1101 does not include the latch circuit 1103.

The divider 1104 is configured for receiving the input clock signal CK and the inverted input clock signal CKB to perform integer frequency-division upon the input clock signal CK and inverted input clock signal CKB to respectively generate a first selection signal S1 and a second selection signal S2. The multiplexer circuit 1105 is coupled to the divider 1104 and is configured for selectively outputting one pulse of the input clock signal CK or one pulse of the inverted input clock signal CKB according to the first selection signal S1 and the second selection signal S2 so as to form and generate a pulse of the frequency-divided clock signal FDCK for generating the frequency-divided clock signal FDCK.

Figure 3:
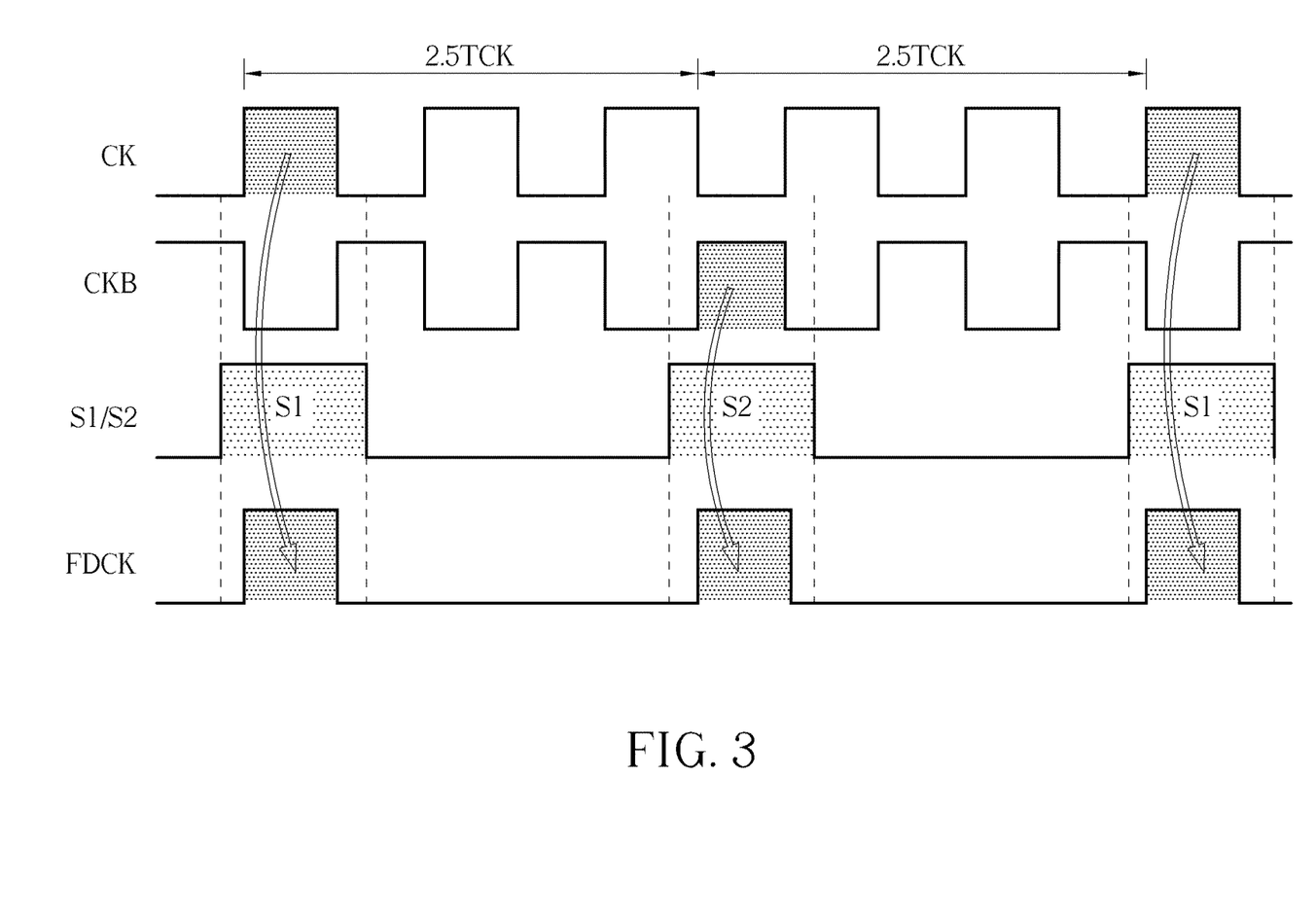
FIG. 3 shows a diagram illustrating an example of waveforms of signals CK, CKB, S1, S2, and FDCK.

Please refer to FIG. 2 in conjunction with FIG. 3. FIG. 3 shows a diagram illustrating an example of waveforms of signals CK, CKB, S1, S2, and FDCK. For example, the frequencies of clock signals CK and CKB are equal to 6 GHz, and the frequency of resultant frequency-divided clock signal FDCK is equal to 2.4 GHz. The divider 1104 is arranged for using the integer dividing factor/parameter of 5 to perform frequency division upon the input clock signal CK to generate the first selection signal S1, and for using the integer dividing factor/parameter of 5 to perform frequency division upon the inverted input clock signal CKB to generate the second selection signal S2, respectively. As shown in FIG. 3, S/S2 indicates the timings of positive pulses of the first selection signal S1 and second selection signal S2; TCK indicates the period of the clock signal CK or CKB. The divider 1104 is arranged to generate one pulse of the first selection signal S1 every five consecutive pulses of the input clock signal CK, to form the selection signal S1. In addition, the divider 1104 is arranged to generate one pulse of the second selection signal S2 every five consecutive pulses of the inverted input clock signal CKB, to form the selection signal S2. The selection signals S1 and S2 generated by the divider 1104 then are outputted to the multiplexer circuit 1105. It should be noted that the pulse widths of selection signals S1 and S2 can be designed to be broader than those of clock signals CK and CKB.

The multiplexer circuit 1105 is arranged for selecting and outputting one pulse of the input clock signal CK if the selection signal S1 is at a high logic level, and for selecting and outputting one pulse of the inverted input clock signal CKB if the selection signal S2 is at a high logic level. As shown in FIG. 3, the frequency-divided clock signal FDCK is formed according to the pulses outputted by the multiplexer circuit 1105, and the frequency of frequency-divided clock signal FDCK is equal to 2.4 GHz since the resultant frequency-divided clock signal FDCK equivalently includes one pulse of the clock signal CK every two and a half pulses and the clock signal CK includes the frequency of 6 GHz. The frequency-divided clock signal FDCK is outputted to the quadrature signal generating circuit 1102.

The quadrature signal generating circuit 1102 as shown in FIG. 2 comprises a double edge flip-flop circuit 1106 and a delay line circuit 1107. The double edge flip-flop circuit 1106 is used as a coarsely adjusting circuit which is configured for coarsely adjusting the phase of the frequency-divided clock signal FDCK with different phase shifts to generate a plurality of coarsely delayed clock signals SOUT1, SOUT2, SOUT3, and SOUT4 wherein the phase of frequency-divided clock signal FDCK is successively delayed with half of a period of the input clock signal CK to respectively generate the signals SOUT1, SOUT2, SOUT3, and SOUT4. In practice, the double edge flip-flop circuit 1106 includes an data input for receiving the frequency-divided clock signal FDCK and is triggered by the input clock signal CK and the inverted input clock signal CKB to coarsely delay the phase of frequency-divided clock signal FDCK so as to generate four delayed signals. The delay line circuit 1107 is used as a finely adjusting circuit which is configured for respectively generating the quadrature clock signals SI, SQ, SIB, and SQB by finely delaying phases of the coarsely delayed clock signals SOUT1, SOUT2, SOUT3, and SOUT4. The delay line circuit 1107 comprises a plurality of delay lines each comprising a plurality of delay cells/units connected in series, and the delay line circuit 1107 is used for finely delaying the above-mentioned four delayed signals so as to generate the four quadrature clock signals SI, SQ, SIB, and SQB.

Figure 4:
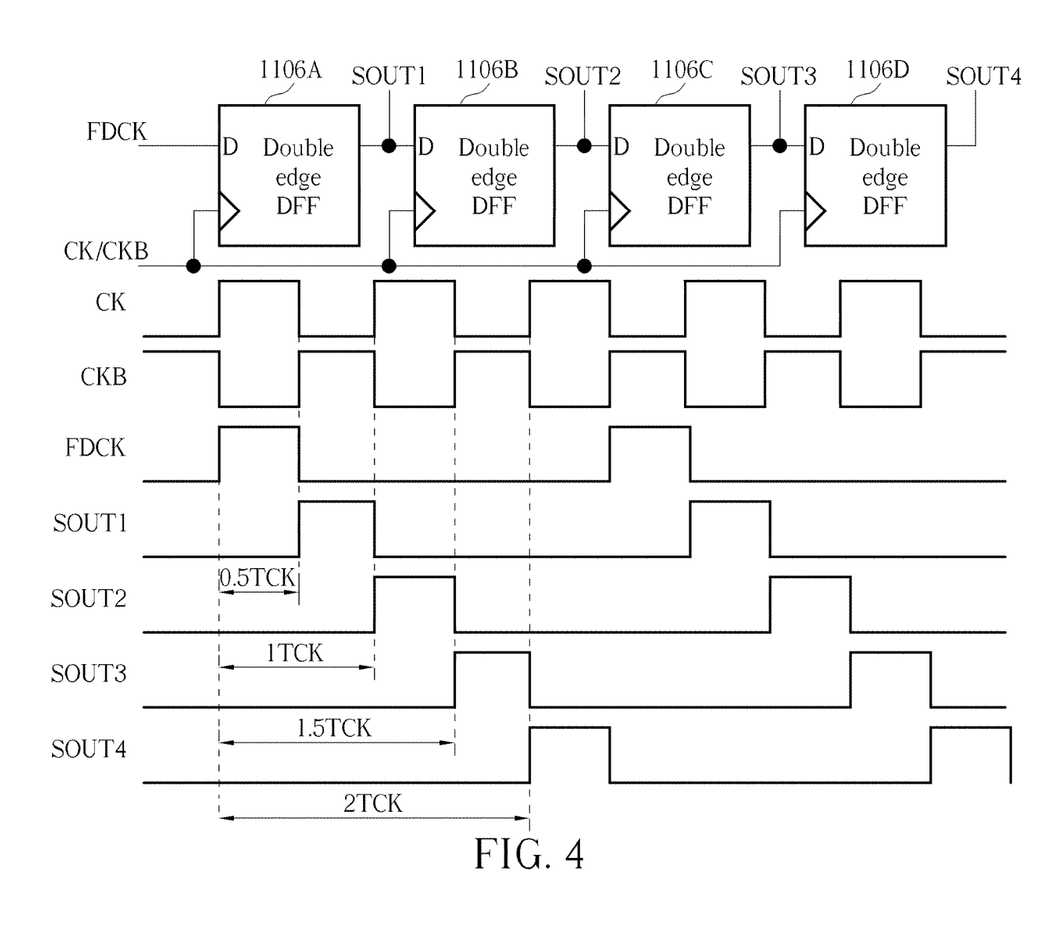
FIG. 4 shows a diagram of an embodiment of the double edge flip-flop circuit as shown in FIG. 2 and an example of waveforms of signals CK, FDCK, SOUT1, SOUT2, SOUT3, and SOUT4.

FIG. 4 shows a diagram of an embodiment of the double edge flip-flop circuit 1106 as shown in FIG. 2 and an example of waveforms of signals CK, FDCK, SOUT1, SOUT2, SOUT3, and SOUT4. As shown in FIG. 4, the double edge flip-flop circuit 1106 comprises a plurality double edge flip-flops 1106A-1106D connected in series. The double edge flip-flops 1106A-1106D are alternatively triggered by rising edges of the clock signals CK and CKB to respectively generate the four coarsely delayed signals SOUT1, SOUT2, SOUT3, and SOUT4. Each of the double edge flip-flops 1106A-1106D is triggered by rising edges of the clock signal CK and rising edges of inverted clock signal CKB. The double edge flip-flop 1106A is arranged for delaying the phase of the clock signal FDCK with half of the period of clock signal CK to generate the signal SOUT1. The double edge flip-flop 1106B is arranged for delaying the phase of the signal SOUT1 with half of the period of clock signal CK to generate the signal SOUT2. The double edge flip-flop 1106C is arranged for delaying the phase of the signal SOUT2 with half of the period of clock signal CK to generate the signal SOUT3. The double edge flip-flop 1106D is arranged for delaying the phase of the signal SOUT3 with half of the period of clock signal CK to generate the signal SOUT4. Thus, the signal SOUT1 is generated and formed by delaying the frequency-divided clock signal FDCK with half of the period TCK of clock signal CK, and the signal SOUT2 is generated and formed by delaying the frequency-divided clock signal FDCK with one times the period TCK of clock signal CK. The signal SOUT3 is generated and formed by delaying the frequency-divided clock signal FDCK with one point five times the period TCK of clock signal CK, and the signal SOUT4 is generated and formed by delaying the frequency-divided clock signal FDCK with two times the period TCK of clock signal CK. The phases of four delayed signals SOUT1, SOUT2, SOUT3, and SOUT4 are then finely delayed (or adjusted) by the delay line circuit 1107 to generate the four quadrature clock signals SI, SQ, SIB, and SQB.

The delay line circuit 1107 comprises four delay lines 1107A-1107D and a calibration circuit 1108 wherein each delay line comprises at least four delay cells (or units) connected in series and having the same delay times. As shown in FIG. 2, each delay line for example comprises five delay cells connected in series and having the same delay times. The first delay cells of four delay lines 1107A-1107D have inputs for respectively receiving the output signals SOUT1, SOUT2, SOUT3, and SOUT4 of double edge flip-flop circuit 1106 to generate corresponding delayed signals as their outputs. The second delay cells of four delay lines 1107A-1107D have inputs for respectively receiving the outputs of the first delay cells to generate corresponding delayed signals as their outputs. The third delay cells of four delay lines 1107A-1107D have inputs for respectively receiving the outputs of the second delay cells to generate corresponding delayed signals as their outputs. The fourth delay cells of four delay lines 1107A-1107D have inputs for respectively receiving the outputs of the third delay cells to generate corresponding delayed signals as their outputs. The fifth delay cells of four delay lines 1107A-1107D have inputs for respectively receiving the outputs of the fourth delay cells to generate corresponding delayed signals as their outputs. The calibration circuit 1108 having an input connected to the output signal of the fifth delay cell of delay line 1107C and an output connected between the first and second delay cells of delay line 1107D, to calibrate and perform phase alignment for the signal at the output of the fifth delay cell of delay line 1107C and the signal at the output of the first delay cell of delay line 1107D. The delay line circuit 1107 is arranged for outputting the output signal of first delay cell of delay line 1107A as the clock signal SI, outputting the output signal of second delay cell of delay line 1107B as the clock signal SQ, outputting the output signal of third delay cell of delay line 1107C as the clock signal SIB, and outputting the output signal of fourth delay cell of delay line 1107D as the clock signal SQB. Each delay cell is arranged for delaying one eighths of the period TCK of the clock signal CK. Thus, in the example, the signal SI is generated by delaying the frequency-divided clock signal FDCK with five eighths of the period TCK of the clock signal CK. The signal SQ is generated by delaying the frequency-divided clock signal FDCK with two eighths and one of the periods TCK of the clock signal CK. The signal SIB is generated by delaying the frequency-divided clock signal FDCK with seven eighths and one of the periods TCK of the clock signal CK. The signal SQB is generated by delaying the frequency-divided clock signal FDCK with four eighths and two of the period TCK of the clock signal CK. Since the period of frequency-divided clock signal FDCK is equal to two point five times the period TCK of the clock signal CK, the above signals SI, SQ, SIB, and SQB are quadrature signals with phase difference of 90 degrees.

Figure 5:
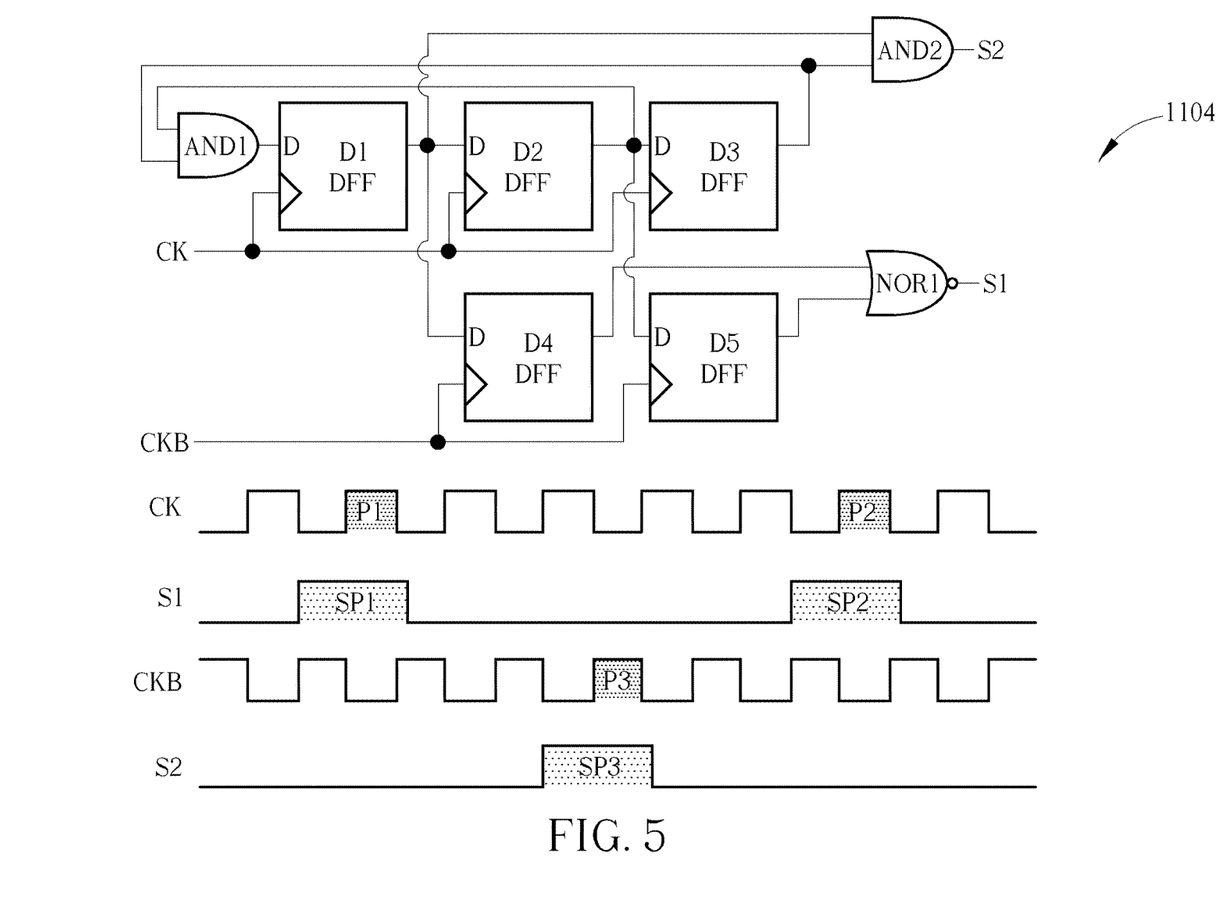
FIG. 5 is a circuit diagram of an embodiment of the divider as shown in FIG. 2 and corresponding waveforms of signals CK, CKB, S1, and S2.

Additionally, the divider 1104 with the dividing parameter of 5 in another embodiment can be implemented by using a plurality of flip-flops (e.g. D-type flip-flop (DFF) but not limited) and logic gates. FIG. 5 is a circuit diagram of an embodiment of the divider 1104 as shown in FIG. 2 and corresponding waveforms of signals CK, CKB, S1, and S2. The divider 1104 comprises a first AND gate ADN1, a first flip-flop D1, a second flip-flop D2, a third flip-flop D3, a second AND gate AND2, a fourth flip-flop D4, a fifth flip-flop D5, and a NOR gate NOR1. The first flip-flop D1 has a data input connected to an output of the first AND gate AND1, a clock input triggered by the input clock signal CK, and a data output. The second flip-flop D2 has a data input connected to the data output of the first flip-flop D1, a clock input triggered by the input clock signal CK, and a data output. The third flip-flop D3 has a data input connected to the data output of the second flip-flop D2, a clock input triggered by the input clock signal CK, and a data output. The two inputs of the first AND gate AND1 are connected to the data output of the second flip-flop D2 and the data output of the third flip-flop D3. The second AND gate AND2 has two inputs connected to the data output of the first flip-flop D1 and the data output of the third flip-flop D3 and is configured for generating the second selection signal S2. The fourth flip-flop D4 has a data input connected to the data output of the first flip-flop D1, a clock input triggered by the inverted input clock signal CKB, and a data output. The fifth flip-flop D5 has a data input connected to the data output of the second flip-flop D2, a clock input triggered by the inverted input clock signal CKB, and a data output. The NOR gate NOR1 has two inputs connected to the data output of the fourth flip-flop D4 and the data output of the fifth flip-flop D5 and is configured for generating the first selection signal S1.

As shown by the waveforms of signals CK, CKB, S1, and S2, when the selection signal S1 is at the pulse SP1 or SP2, the multiplexer circuit 1105 of FIG. 2 is arranged to output the pulse P1 or P2 of the input clock signal CK to form a pulse of the frequency-divided clock signal FDCK. When the selection signal S2 is at the pulse SP3, the multiplexer circuit 1105 is arranged to output the pulse P3 of the inverted input clock signal CKB to form a pulse of the frequency-divided clock signal FDCK. Thus, to properly generate a pulse of the signal FDCK, it only requires designing the operation frequency/rate of circuit elements of the divider 1104 and multiplexer circuit 1105 as a frequency higher than two times the frequency of signal CK. Compared to some conventional schemes requiring designing the operation frequency/rate of conventional circuit elements as a frequency within a particular range such as a frequency range corresponding to the range from 0.75 times TCK to one TCK (TCK indicates the period of the clock signal CK or CKB), it is easier for readers to implement the divider 1104 with a frequency range corresponding to the range of zero to 0.5 times TCK since the readers/designers only need to configure the operation frequency/rate of divider 1104 as a frequency higher than double of the clock frequency corresponding to the period TCK. This effectively solves the problems due to corner variations.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A quadrature clock generating apparatus coupled to a local oscillator generating an input clock signal and an inverted input clock signal, the quadrature clock generating apparatus comprising:
   a fractional dividing circuit, configured for receiving the input clock signal and the inverted input clock signal, and for performing frequency-division upon the input clock signal and the inverted input clock signal to generate a frequency-divided clock signal according to a fractional dividing parameter; and
   a quadrature signal generating circuit, coupled to the fractional dividing circuit and the local oscillator, configured for receiving the input clock signal, the inverted input clock signal, and the frequency-divided clock signal to generate a plurality of quadrature clock signals.

2. The apparatus of claim 1, wherein the quadrature signal generating circuit is arranged for generating the quadrature clock signals by delaying a phase of the frequency-divided clock signal with different phase shifts according to the input clock signal and the inverted input clock signal.

3. The apparatus of claim 1, wherein the fractional dividing circuit comprises:
   a divider with an integer dividing parameter which is multiple of the fractional dividing parameter, configured for receiving the input clock signal and the inverted input clock signal to perform integer frequency-division upon the input clock signal and the inverted input clock signal to respectively generate a first selection signal and a second selection signal; and
   a multiplexer circuit, coupled to the divider, configured for selectively outputting one pulse of the input clock signal or one pulse of the inverted input clock signal according to the first selection signal and the second selection signal so as to form and generate a pulse of the frequency-divided clock signal.

4. The apparatus of claim 3, wherein the divider comprises:
   a first AND gate;
   a first flip-flop, having a data input connected to an output of the first AND gate, a clock input triggered by the input clock signal, and a data output;
   a second flip-flop, having a data input connected to the data output of the first flip-flop, a clock input triggered by the input clock signal, and a data output;
   a third flip-flop, having a data input connected to the data output of the second flip-flop, a clock input triggered by the input clock signal, and a data output, two inputs of the first AND gate being connected to the data output of the second flip-flop and the data output of the third flip-flop;
   a second AND gate, having two inputs connected to the data output of the first flip-flop and the data output of the third flip-flop and configured for generating the second selection signal;
   a fourth flip-flop, having a data input connected to the data output of the first flip-flop, a clock input triggered by the inverted input clock signal, and a data output;
   a fifth flip-flop, having a data input connected to the data output of the second flip-flop, a clock input triggered by the inverted input clock signal, and a data output; and
   a NOR gate, having two inputs connected to the data output of the fourth flip-flop and the data output of the fifth flip-flop and configured for generating the first selection signal.

5. The apparatus of claim 3, wherein the fractional dividing circuit further comprises:
   a latch circuit, coupled between the local oscillator and the divider, comprising two inverters each including an input connected to an output of the other, a first end between the two inverters being used for receiving the input clock signal, a second end between the two inverters being used for receiving the inverted input clock signal.

6. The apparatus of claim 1, wherein the quadrature signal generating circuit comprises:

a first adjusting circuit, configured for coarsely adjusting the phase of the frequency-divided clock signal with different phase shifts to generate a plurality of first delayed clock signals; and a second adjusting circuit, coupled to the first adjusting circuit, configured for respectively generating the quadrature clock signals by finely delaying phases of the first delayed clock signals.

7. The apparatus of claim 6, wherein, the phase of frequency-divided clock signal is successively delayed with half of a period of the input clock signal to respectively generate the first delayed clock signals, and the first adjusting circuit is a double edge flip-flop circuit which comprises a plurality of double edge flip-flops connected in series to respectively generate the first delayed clock signals; each double edge flip-flop has a clock input which is triggered by a rising edge of the input clock signal and a rising edge of the inverted input clock signal.

8. The apparatus of claim 6, wherein the second adjusting circuit comprises a plurality of delay lines each comprising a plurality of delay cells connected in series; each delay cell is used for receiving an input signal and arranged for delaying the input signal with one eighths of the period of the input clock signal.

9. A communication system transmitter, comprising:

the quadrature clock generating apparatus of claim 1;

a mixer, connected to the quadrature clock generating apparatus, configured for performing up-conversion upon a baseband signal to generate an up-converted signal according to the four quadrature clock signals;

a band-pass filter, connected to the mixer, configured for performing band-pass filtering upon the up-converted signal; and a power amplifier, connected to the band-pass filter, configured for controlling a power of the up-converted signal with a power gain so as to transmit the up-converted signal into air via an antenna circuit of the communication system transmitter.

\* \* \* \* \*